(12) United States Patent
Cheng

(10) Patent No.: US 10,537,047 B2
(45) Date of Patent: Jan. 14, 2020

(54) HEAT DISSIPATION STRUCTURE AND DISPLAY DEVICE

(71) Applicants: HKC Corporation Limited, Shenzhen (CN); Chongqing HKC Optoelectronics Technology Co.,ltd., Chongqing (CN)

(72) Inventor: Jiahe Cheng, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/338,523

(22) PCT Filed: Jul. 5, 2017

(86) PCT No.: PCT/CN2017/091884
§ 371 (c)(1),
(2) Date: Apr. 1, 2019

(87) PCT Pub. No.: WO2018/214245
PCT Pub. Date: Nov. 29, 2018

(65) Prior Publication Data
US 2019/0223332 A1 Jul. 18, 2019

(30) Foreign Application Priority Data
May 26, 2017 (CN) .......................... 2017 1 0386685

(51) Int. Cl.
*H05K 7/20* (2006.01)
*H05K 1/11* (2006.01)
*H05K 1/18* (2006.01)
*H05K 5/00* (2006.01)
*H05K 1/02* (2006.01)

(52) U.S. Cl.
CPC ....... *H05K 7/20963* (2013.01); *H05K 1/0204* (2013.01); *H05K 1/028* (2013.01); *H05K 1/11* (2013.01); *H05K 1/115* (2013.01); *H05K 1/181* (2013.01); *H05K 5/0017* (2013.01); *H05K 2201/056* (2013.01)

(58) Field of Classification Search
CPC .. H05K 7/20963; H05K 1/0204; H05K 1/028; H05K 1/11; H05K 1/115; H05K 1/181; H05K 5/0017; H05K 2201/056; H05K 1/0203; H05K 7/2039; H05K 2201/066; H05K 3/0061; H05K 2201/10128; H05K 7/20954; H05K 7/20854; H01L 2224/45014; G06F 1/20; G06F 1/183; G06F 3/147
USPC ................ 361/719, 709, 704, 707, 710, 720
See application file for complete search history.

(56) References Cited

U.S. PATENT DOCUMENTS 7,064,952 B1 * 6/2006 Chen .................. H05K 5/02
349/58

* cited by examiner

*Primary Examiner* — Mandeep S Buttar
(74) *Attorney, Agent, or Firm* — WPAT, PC

(57) ABSTRACT

The present application discloses a heat dissipation structure and a display device, the heat dissipation structure includes a backplate, a circuit board, and a thermal pad; the circuit board includes a first contact area and a second contact area, and the second contact area is in contact with the backplate; a first end of the thermal pad is affixed to a chip of a flexible circuit board of the display device, and a second end of the thermal pad is affixed to the first contact area so as to conduct heat of the chip to the circuit board and the backplate.

18 Claims, 3 Drawing Sheets

HEAT DISSIPATION STRUCTURE AND DISPLAY DEVICE

TECHNICAL FIELD

The present application relates to the field of display technology, and more particularly to a heat dissipation structure and a display device.

DESCRIPTION OF RELATED ART

The display panel and the circuit board of the existing liquid crystal display are connected to each other through a flexible circuit board (Chip On Flex, or, Chip On Film, referred to as COF), wherein the flexible circuit board is provided with an IC (integrated circuit) chip, for driving the display panel in accordance with the control signal of the circuit board. At present, the IC chips of the flexible circuit board in the display panel dissipate heat to the air naturally. However, high-end products generate a larger amount of heat because the computing speed and computing volume of the IC chip are relatively large; if the IC chip has no auxiliary heat dissipation structure, the IC chip temperature is easily getting too high, and the performance is affected, the service life is reduced, or even product failure will be directly caused due to high temperature.

SUMMARY

The embodiment of the present application provides a heat dissipation structure and a display device, the purpose thereof is to improve the chip heat dissipation problem of a flexible circuit board of the display device.

In one aspect, a heat dissipation structure is provided for applying in the display device, the heat dissipation structure including:

a backplate;

a circuit board, disposed on the backplate, wherein the circuit board includes a first contact area and a second contact area connected with the first contact area, and the second contact area is also in contact with the backplate;

a thermal pad, wherein a first end of the thermal pad is affixed to a chip of a flexible circuit board of the display device, and a second end of the thermal pad is affixed to the first contact area, thereby conducting heat of the chip to the circuit board and the backplate.

In the heat dissipation structure of the present application, the first contact area and the second contact area are oppositely disposed on both sides of the circuit board and are connected to each other through a via hole.

In the heat dissipation structure of the present application, the thermal pad is provided with a through hole; the heat dissipation structure further includes:

a fixed member, passing through the through hole and the via hole to abut the backplate, so as to fix the thermal pad.

In the heat dissipation structure of the present application, the first end of the thermal pad is bonded to the chip of the flexible circuit board by double-sided thermally conductive adhesive; the second end of the thermal pad is bonded to the first contact area by double-sided thermally conductive adhesive.

In the heat dissipation structure of the present application, both the first contact area and the second contact area are exposed copper areas.

In the heat dissipation structure of the present application, the thermal pad includes an aluminum foil thermal pad, a copper foil thermal pad or a graphene thermal pad.

In another aspect, the present application further provides a display device including:

a backplate;

a display panel, disposed on the backplate;

a circuit board, disposed on the backplate, wherein the circuit board includes a first contact area and a second contact area connected with the first contact area, and the second contact area being also in contact with the backplate;

a flexible circuit board, including a chip, for connecting the display panel and the circuit board;

a thermal pad, wherein a first end of the thermal pad is affixed to the chip and a second end of the thermal pad is affixed to the first contact area, thereby conducting heat of the chip to the circuit board and the backplate.

In the display device of the present application, the first contact area and the second contact area are disposed on both sides of the circuit board and are connected to each other through a via hole.

In the display device of the present application, the thermal pad is provided with a through hole; the heat dissipation structure further includes:

a fixed member, passing through the through hole and the via hole to abut the backplate, so as to fix the thermal pad.

In the display device of the present application, the first end of the thermal pad is bonded to the chip of the flexible circuit board by double-sided thermally conductive adhesive; and the second end of the thermal pad is bonded to the first contact area by double-sided thermally conductive adhesive.

The embodiment of the present application provides a heat dissipation structure and a display device, wherein the heat dissipation structure includes a backplate, a circuit board, and a thermal pad; The circuit board is disposed on the backplate, the circuit board is provided with a first contact area and a second contact area connected to the first contact area, and the second contact area is in contact with the backplate; a thermal pad, wherein a first end of the thermal pad is affixed to a chip of a flexible circuit board of the display device, the second end of the thermal pad is affixed to the first contact area, thereby conducting heat of the chip to the circuit board and the backplate. Therefore, the heat dissipation structure is formed by the thermal pad, the circuit board, and the backplate, and the heat dissipation structure serves as an auxiliary to dissipate heat the chip of the flexible circuit board, thereby reducing the temperature of the chip and improving the service life thereof.

BRIEF DESCRIPTION OF THE DRAWINGS

The following sections offer a clear, complete description of the present application in combination with the embodiments and accompanying drawings. Obviously, the embodiments described herein are only a part of, but not all the embodiments of the present application. In view of the embodiments described herein, any other embodiment obtained by the person skilled in the field without offering creative effort is included in a scope claimed by the present application.

DETAILED DESCRIPTION OF EMBODIMENTS

The following sections offer a clear, complete description of the present application in combination with the embodiments and accompanying drawings. Obviously, the embodiments described herein are only a part of, but not all the embodiments of the present application. In view of the embodiments described herein, any other embodiment obtained by those of ordinary skill in the art skilled in this art without offering creative effort is included in a scope claimed by the present application.

Figure 1:
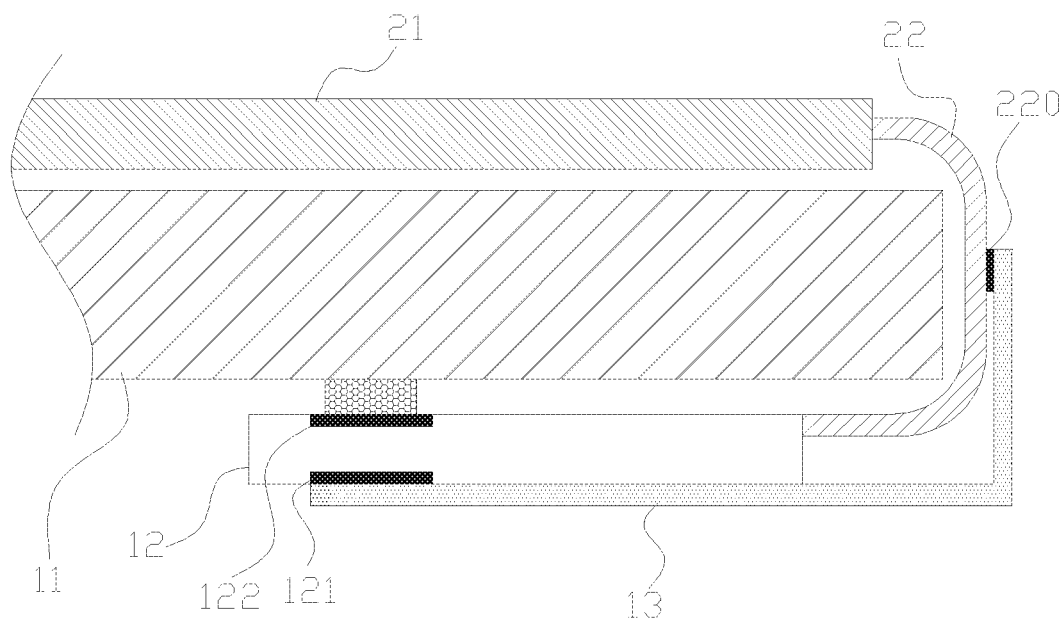
FIG. 1 is a schematic cross-sectional view of a heat dissipation structure according to an embodiment of the present application.

Referring to FIG. 1, FIG. 1 is a schematic cross-sectional view of a heat dissipation structure according to an embodiment of the present application. The heat dissipation structure may be specifically mounted on the display device for dissipating heat on the chip of the display device. As shown in FIG. 1, the heat dissipation structure includes a backplate 11, a circuit board 12, and a thermal pad 13. The backplate 11 is for mounting the display panel 21 and the circuit board 12 of the display device, wherein the display panel 21 and the circuit board 12 are connected by at least one flexible circuit board 22. The flexible circuit board 22 is provided with a chip 220. The chip 220 is a driver chip, for driving the display panel 21 to work in accordance with a control signal of the circuit board.

The circuit board 12 includes a first contact area 121 and a second contact area 122. The first contact area 121 is connected to the second contact area 12 for conducting signals, for example, for conducting current or heat. The circuit board 12 may be a printed circuit board, for example; the first contact area 121 and the second contact area 122 are disposed on the surface of the printed circuit board. The first contact area 121 and the second contact area 122 are specifically metal contact areas, and are disposed on the surface of the printed circuit board by deposition or the like.

Figure 2:
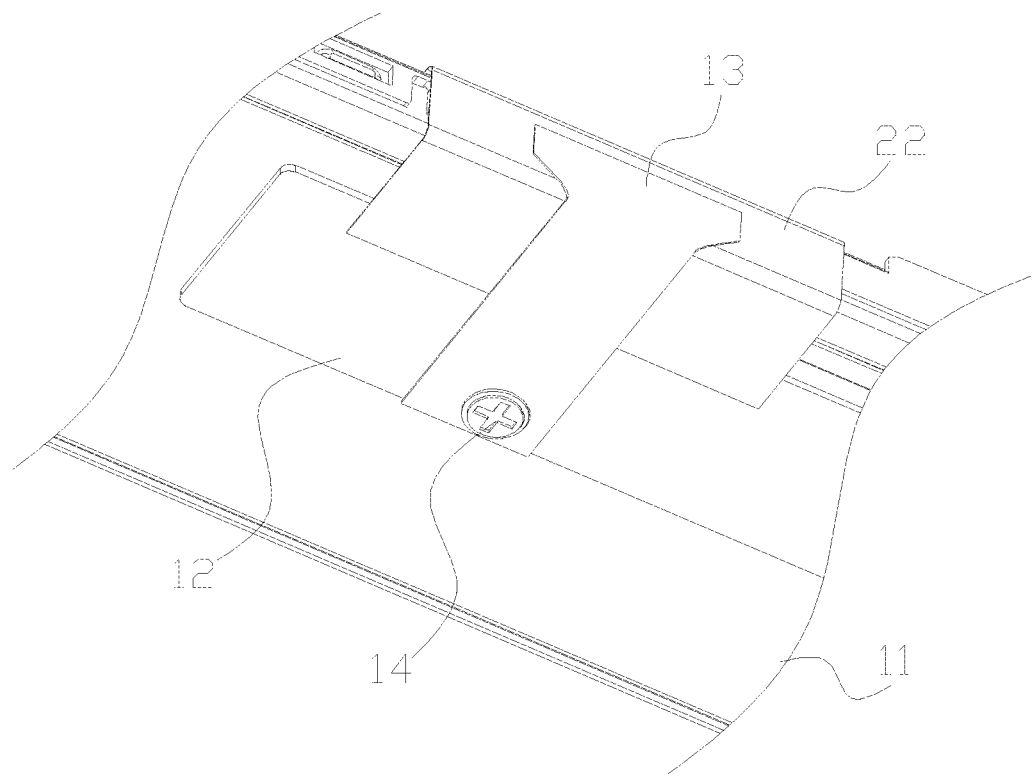
FIG. 2 is a schematic view of a mounting structure of a heat dissipation structure according to an embodiment of the present application.

The first end of the thermal pad 13 is affixed to the chip 220 of the flexible circuit board 22 and the second end of the thermal pad 13 is affixed to the first contact area 121 of the circuit board 12. The effect after affixing as shown in FIG. 2, the chip 220 of the flexible circuit board 22 is affixed and covered by one end of the thermal pad 13 so that the end of the thermal pad 13 is sufficiently in contact with the chip 220 of the flexible circuit board 22; the other end of the thermal pad 13 is affixed to the first contact area 121 of the circuit board 12 so as to form a heat dissipation channel structure through the thermal pad 13, and the first contact area 121 and the second contact area 122 of the circuit board to the backplate 11; the heat dissipation channel structure is used for conducting the heat to the circuit board 12 and the backplate 11 when the chip 220 on the flexible circuit board 22 works and generates heat, thereby accelerating the heat dissipation rate of the chip 220 on the flexible circuit board 22.

It should be noted that the flexible circuit board 22 may be, for example, a COF (Chip On Flex, or Chip On Film), the COF is provided with a chip, i.e., a driver IC chip. The driver IC chip will produce a certain amount of heat when driving the display device to work, especially the driver IC chip of the high-end products will produce greater heat due to its large amount of computing, if not timely heat dissipating, the driver IC chip temperature is easily getting too high, and the performance is affected, the driver IC chip will be burned in serious condition, and the service life is reduced.

Thus, the heat dissipation structure forms a heat dissipation channel structure through the backplate 11, the circuit board 12 and the thermal pad 13 for dissipate heat of the chip of the flexible circuit board, thereby reducing the temperature of the chip and improving the service life thereof. That is, even a high-end product using a high-performance chip, the heat dissipation structure can also effectively reduce the temperature of the chip to ensure normal work thereof.

It is to be noted that in the present embodiment, the size of the first end portion of the thermal pad 13 (i.e., the end portion in contact with the chip of the flexible circuit board) is larger than that of the second end portion (i.e., the end portion in contact with the circuit board) of the thermal pad to increase the heat dissipation effect. In other embodiments, the both end portions of the thermal pad 13 may not be restricted.

In the present embodiment, the first end of the thermal pad 13 is bonded to the chip 220 of the flexible circuit board 22 by double-sided thermally conductive adhesive; and the second end of the thermal pad 13 is bonded to the first contact area 121 by double-sided thermally conductive adhesive. The double-sided thermally conductive adhesive is used not only for fixed connections but also for heat conduction. In some embodiments, affixing connections may also be made in other ways, or affixing connections may also be made by other thermally conductive adhesive.

Figure 3:
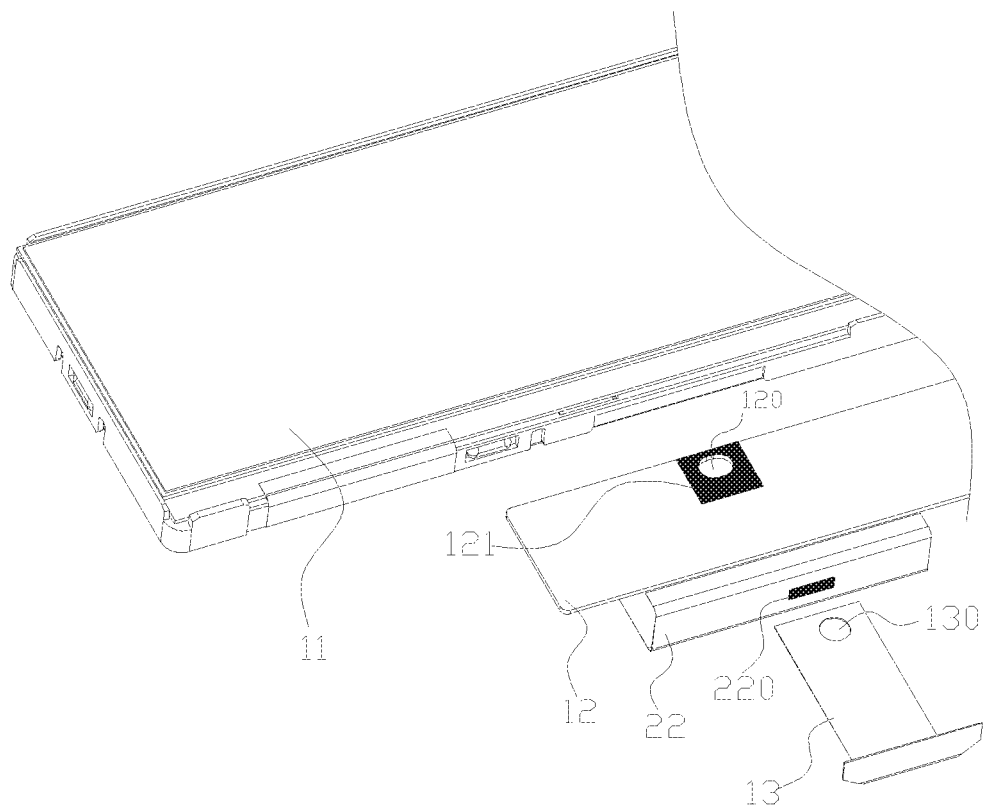
FIG. 3 is a schematic view of an exploded structure of a heat dissipation structure according to an embodiment of the present application.

In the present embodiment, as shown in FIG. 3, the first contact area 121 and the second contact area 122 of the circuit board 12 are oppositely disposed on both sides of the circuit board 12, and the first contact area 121 and the second contact area 122 are connected to each other through a via hole. The first contact area 121 and the second contact area 122 of the circuit board 12 are connected to each other through a via hole 120.

It should be noted that in the present embodiment, as shown in FIG. 3, the first contact area 121 and the second contact area 122 of the circuit board 12 are both exposed copper areas, and the via hole 120 is a copper hole. In some embodiments, the first contact area 121 and the second contact area 122 may also be subjected to a correlation process to accelerate heat conduction, such as coating a heat conducting material, coating graphene, or plating silver.

In the present embodiment, as shown in FIG. 3, the display panel and the circuit board 12 are oppositely disposed on both sides of the backplate 11, and may be disposed on the same side of the backplate 11 in other embodiments.

Figure 4:
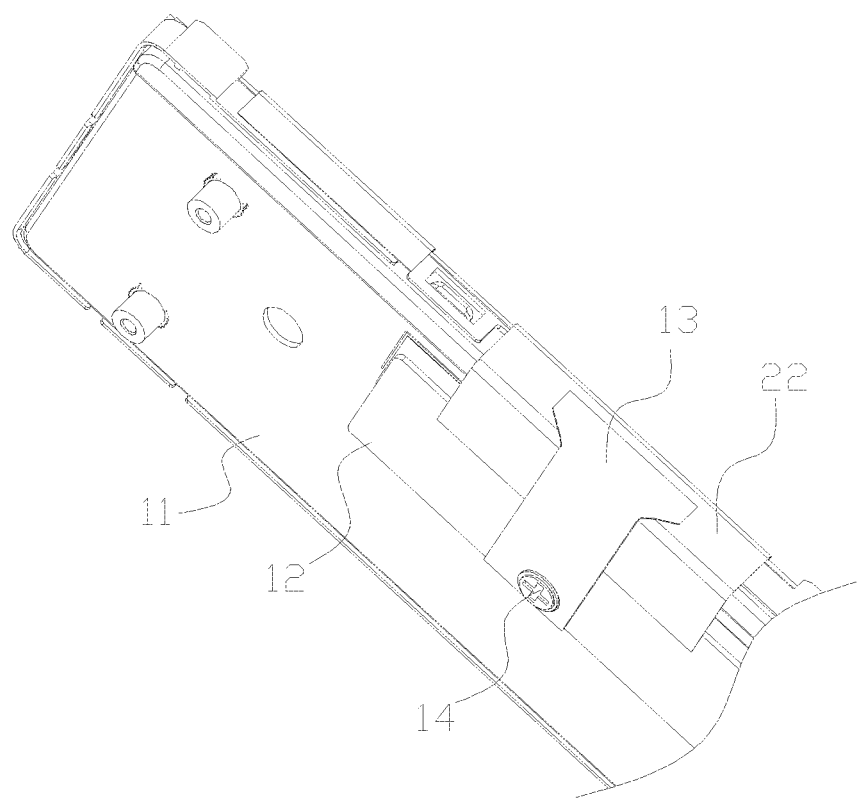
FIG. 4 is another schematic view of a mounting structure of a heat dissipation structure according to an embodiment of the present application.

In the present embodiment, as shown in FIG. 3, the thermal pad 13 is provided with a through hole 130. Specifically, a through hole 130 is provided at one end of the thermal pad 13, and the through hole 130 corresponds to the via hole 120 when the thermal pad 13 is affixed to the circuit board 12. The heat dissipation structure also includes a fixed member 14, as shown in FIG. 4, the fixed member may be a fixing screw, for example; the fixing screw may be a metal screw having good thermal conductivity, for fixing the thermal pad 13 and conducting heat. Specifically, the fixed member 14 passes through the through hole 130 and the via hole 120 to abut the backplate 11, for fixing the thermal pad 13 and conducting heat from the thermal pad 13 to the backplate 11.

In the present embodiment, the thermal pad 13 includes, but is not limited to, an aluminum foil thermal pad, a copper foil thermal pad or a graphene thermal pad, and the thickness of the thermal pad is not limited.

In the present embodiment, as shown in FIG. 4, FIG. 4 is a partial view of the heat dissipation structure. The backplate 11 is used for mounting the display panel and the circuit board 22, the display panel can be mounted on the backplate 11 by way of engagement or affixing; the circuit board 22 can be mounted on the backplate 11 by screw-fixing. The display panel and the circuit board 22 are connected by at least one flexible circuit board 22, it is thus understood that the heat dissipation structure is provided on the chip of each flexible circuit board 22 so that a display panel includes a plurality of heat dissipation structures, wherein the heat dissipation structures share the same backplate 11 and the circuit board 12.

Figure 5:
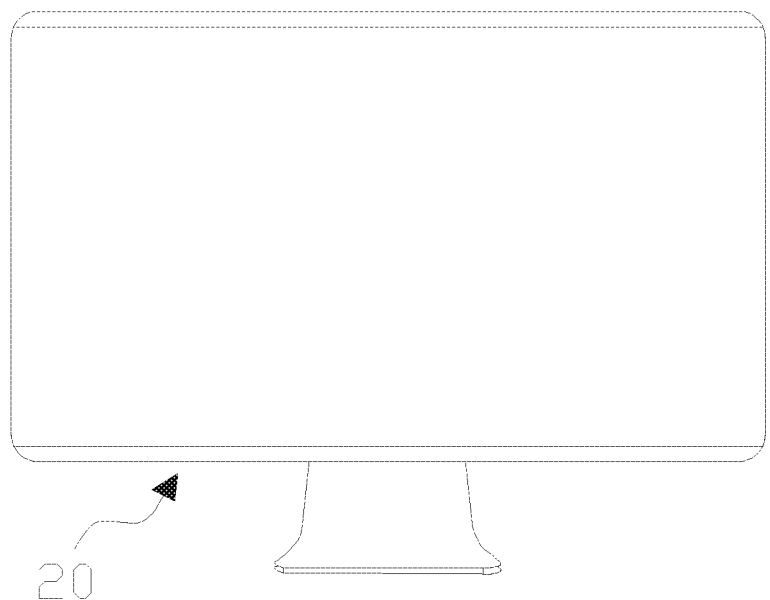
FIG. 5 is a schematic structural view of a display device according to an embodiment of the present application.

Referring to FIG. 5, FIG. 5 is a schematic structural view of a display device provided by an embodiment of the present application. The display device includes a heat dissipation structure of the embodiment. As shown in FIG. 5, conjunction with FIG. 1 to FIG. 3, the display device 20 includes a backplate 11, a circuit board 12, a thermal pad 13, a flexible circuit board 22, and a display panel (not shown). The display panel is disposed on the backplate 11, and the circuit board 12 is also disposed on the backplate 11. Specifically, the display panel and the circuit board 12 are oppositely disposed on both sides of the backplate 11 so as to save the space of the display device. The flexible circuit board 22 is disposed at one end portion of the backplate 11, a chip is disposed on the flexible circuit board, for connecting the display panel and the circuit board, and specifically, gate lines or data lines of an array substrate of the display panel are connected to the circuit board by the flexible circuit board. The chip 220 is a driver chip, for driving the display panel 21 to work in accordance with control signals of the circuit board.

The circuit board 12 includes a first contact area 121 and a second contact area 122. The first contact area 121 is connected to the second contact area 12 for conducting a signal, for example, for conducting current or heat. The circuit board 12 may be a printed circuit board, for example; the first contact area 121 and the second contact area 122 are disposed on the surface of the printed circuit board. The first contact area 121 and the second contact area 122 are specifically metal contact areas and are disposed on the surface of the printed circuit board by deposition or the like.

The first end of the thermal pad 13 is affixed to the chip 220 of the flexible circuit board 22 and the second end of the thermal pad 13 is affixed to the first contact area 121 of the circuit board 12. The effect after affixing as shown in FIG. 2, the chip 220 of the flexible circuit board 22 is affixed and covered by one end of the thermal pad 13 so that one end of the thermal pad 13 is sufficiently in contact with the chip 220 on the flexible circuit board 22 The other end of the thermal pad 13 is affixed to the first contact area 121 of the circuit board 12 so as to form a heat dissipation channel structure to the backplate 11 through the first contact area 121 and the second contact area 122 of the circuit board 13; the heat dissipation channel structure is used for conducting the heat to the circuit board 12 and the backplate 11 when the chip 220 on the flexible circuit board 22 works and generates heat, thereby accelerating the heat dissipation rate of the chip 220 on the flexible circuit board 22.

It should be noted that the flexible circuit board 22 may be, for example, a COF (Chip On Flex, or Chip On Film), the COF is provided with a chip, i.e., a driver IC chip. The driver IC chip will produce a certain amount of heat when driving the display device to work, especially the driver IC chip of the high-end products will produce greater heat due to its large amount of computing, if not timely heat dissipating, the driver IC chip temperature is easily getting too high, and affects its performance, the driver IC chip will be burned in serious condition, and the service life thereof is reduced.

Thus, the heat dissipation structure is formed by the cooperation of the backplate 11, the circuit board 12 and the thermal pad 13 to form a heat dissipation channel structure for dissipating the heat of the chip of the flexible circuit board, thereby reducing the temperature of the chip and improving the service life thereof. Therefore, the display device 20 using the heat dissipation structure can dissipate the heat of the chip of the flexible circuit board by the heat dissipation structure, thereby reducing the temperature of the chip, ensuring the work performance of the chip, and improving the service life thereof.

It is to be noted that in the present embodiment, the size of the first end portion of the thermal pad 13 (i.e., the end portion in contact with the chip of the flexible circuit board 22) is larger than that of the second end portion (i.e., the end portion in contact with the circuit board 12) to increase the heat conduction effect. In other embodiments, the both end portions of the thermal pad 13 may not be restricted.

In the present embodiment, the first end of the thermal pad 13 is bonded to the chip 220 of the flexible circuit board 22 by double-sided thermally conductive adhesive; and the second end of the thermal pad 13 is bonded to the first contact area 121 by double-sided thermally conductive adhesive. The double-sided thermally conductive adhesive is used not only for fixed connections but also for heat conduction. In some embodiments, affixing connections may also be made in other ways, or affixing connections may also be made by other thermally conductive adhesive.

In the present embodiment, as shown in FIG. 3, the first contact area 121 and the second contact area 122 of the circuit board 12 are oppositely disposed on both sides of the circuit board 12, and the first contact area 121 and the second contact area 122 are connected to each other through a via hole. The first contact area 121 and the second contact area 122 of the circuit board 12 are connected to each other through a via hole 120.

It should be noted that in the present embodiment, as shown in FIG. 3, the first contact area 121 and the second contact area 122 of the circuit board 12 are both exposed copper areas, and the via hole 120 is a copper hole. In some embodiments, the first contact area 121 and the second contact area 122 may also be subjected to a correlation process to accelerate heat conduction, such as coating a heat conducting material, coating graphene, or plating silver.

In the present embodiment, as shown in FIG. 3, the thermal pad 13 is provided with a through hole 130. Specifically, the through hole 130 is provided at one end of the thermal pad 13, and the through hole 130 corresponds to the via hole 120 when the thermal pad 13 and the circuit board 12 are affixed and mounted. The heat dissipation structure also includes a fixed member 14, as shown in FIG. 4, the fixed member 14 may be a fixing screw, for example; the fixing screw may be a metal screw having good thermal conductivity, for fixing the thermal pad 13 and conducting heat. Specifically, the fixed member 14 passes through the through hole 130 and the via hole 120 to abut the backplate 11, for fixing the thermal pad 13 and conducting heat from the thermal pad 13 to the backplate 11.

In the present embodiment, the thermal pad 13 includes, but is not limited to, an aluminum foil thermal pad, a copper foil thermal pad, a silver foil thermal pad, a gold foil thermal pad, a composite material heat conducting sheet thermal pad, a graphene thermal pad or thermal pads made of other material; and the thickness of the thermal pad is not limited.

In some embodiments, the display panel may be, for example, a liquid crystal display panel, an OLED display panel, a QLED display panel, or other display panels.

In the present embodiment, the display device 20 may be, for example, a liquid crystal display device, an OLED display device, a QLED display device, or other type of display device.

It is to be understood that in this embodiment, the display device 20 in FIG. 5 is a computer display device or a TV display device. In other embodiments, the display device 20 may also be a display of other electronic devices such as a tablet computer or a mobile phone, and the shape of the display device 20 in FIG. 5 is not intended to limit the specific structure of the display device in the present application.

Above are only embodiments of the present application, is not patented and therefore limit the scope of the present application, the use of any content of the present specification and drawings made equivalent or equivalent structural transformation process, either directly or indirectly related to the use of other technologies areas are included in the same way the scope of the patent protection of the present application. Accordingly, the scope of protection of the present application is subject to the scope of protection of the claims.

What is claimed is:

1. A heat dissipation structure, applied to a display device, comprising:
   a backplate;
   a circuit board, disposed on the backplate, wherein the circuit board comprises a first contact area and a second contact area, and the first contact area and the second contact area are oppositely disposed on both sides of the circuit board and connected to each other through a via hole, and the second contact area is also in contact with the backplate;
   a thermal pad, comprising a through hole;
   a fixed member, passing through the through hole and the via hole to abut the backplate, so as to fix the thermal pad;
   wherein a first end of the thermal pad is affixed to a chip of a flexible circuit board, and a second end of the thermal pad is affixed to the first contact area, thereby conducting heat of the chip to the circuit board and the backplate.

2. The heat dissipation structure according to claim 1, wherein the size of the first end of the thermal pad is larger than that of the second end.

3. The heat dissipation structure according to claim 1, wherein the first end of the thermal pad is bonded to the chip of the flexible circuit board by double-sided thermally conductive adhesive; and the second end of the thermal pad is bonded to the first contact area by double-sided thermally conductive adhesive.

4. The heat dissipation structure according to claim 1, wherein both the first contact area and the second contact area are exposed copper areas.

5. The heat dissipation structure according to claim 1, wherein the first contact area and the second contact area are coated with thermally conductive material.

6. The heat dissipation structure according to claim 1, wherein the thermal pad comprises an aluminum foil thermal pad, a copper foil thermal pad, or a graphene thermal pad.

7. The heat dissipation structure according to claim 1, wherein the flexible circuit board comprises a chip-on-film.

8. A heat dissipation structure, applied in a display device, comprising: a backplate; a circuit board, disposed on the backplate, wherein the circuit board comprises a first contact area and a second contact area connected with the first contact area, and the second contact area is also in contact with the backplate; a thermal pad, wherein a first end of the thermal pad is affixed to a chip of a flexible circuit board of the display device, and a second end of the thermal pad is affixed to the first contact area, thereby conducting heat of the chip to the circuit board and the backplate; wherein the first contact area and the second contact area are oppositely disposed on both sides of the circuit board and are connected to each other through a via hole.

9. The heat dissipation structure according to claim 8, wherein the thermal pad comprises a through hole; the heat dissipation structure further comprising: a fixed member, passing through the through hole and the via hole to abut the backplate, so as to fix the thermal pad.

10. The heat dissipation structure according to claim 8, wherein the first end of the thermal pad is bonded to the chip of the flexible circuit board by double-sided thermally conductive adhesive; and the second end of the thermal pad is bonded to the first contact area by double-sided thermally conductive adhesive.

11. The heat dissipation structure according to claim 8, wherein both the first contact area and the second contact area are exposed copper areas.

12. The heat dissipation structure according to claim 8, wherein the thermal pad comprises an aluminum foil thermal pad, a copper foil thermal pad or a graphene thermal pad.

13. The heat dissipation structure according to claim 8, wherein the flexible circuit board comprises a chip-on-film.

14. A display device, comprising: a backplate; a display panel, disposed on the backplate; a circuit board, disposed on the backplate, wherein the circuit board comprises a first contact area and a second contact area connected to the first contact area, and the second contact area is in contact with the backplate; a flexible circuit board, comprising a chip, for connecting the display panel and the circuit board; a thermal pad, wherein a first end of the thermal pad is affixed to the chip and a second end of the thermal pad is affixed to the first contact area, thereby conducting heat of the chip to the circuit board and the backplate; wherein the first contact area and the second contact area are oppositely disposed on both sides of the circuit board and are connected to each other through a via hole.

15. The display device according to claim 14, wherein the thermal pad comprises a through hole; the heat dissipation structure further comprising: a fixed member, passing through the through hole and the via hole to abut the backplate, so as to fix the thermal pad.

16. The display device according to claim 14, wherein the first end of the thermal pad is bonded to the chip of the flexible circuit board by double-sided thermally conductive adhesive; and the second end of the thermal pad is bonded to the first contact area by double-sided thermally conductive adhesive.

17. The display device according to claim 14, wherein both the first contact area and the second contact area are exposed copper areas.

18. The heat dissipation structure according to claim 14, wherein the thermal pad comprises an aluminum foil thermal pad, a copper foil thermal pad or a graphene thermal pad.

* * * * *